(12) United States Patent  
Naletov et al.

(10) Patent No.: US 7,528,663 B2  
(45) Date of Patent: May 5, 2009

(54) MICROWAVE OSCILLATOR TUNED WITH A FERROMAGNETIC THIN FILM

(75) Inventors: Vladimir Naletov, Gif sur Yvette (FR); Olivier Klein, Gif sur Yvette (FR)

(73) Assignee: Commissariat a l'Energie Atomique, Paris (FR)

( * ) Notice: Subject to any disclaimer, the term of this patent is extended or adjusted under 35 U.S.C. 154(b) by 119 days.

(21) Appl. No.: 11/662,838

(22) PCT Filed: Sep. 15, 2004

(86) PCT No.: PCT/EP2004/010987

§ 371 (c)(1), (2), (4) Date: Jul. 3, 2007

(87) PCT Pub. No.: WO2006/029649

PCT Pub. Date: Mar. 23, 2006

(65) Prior Publication Data

US 2007/0247243 A1   Oct. 25, 2007

(51) Int. Cl.  
H03L 7/099   (2006.01)

(52) U.S. Cl. .................................... 331/1 R; 331/177 R

(58) Field of Classification Search ................ 331/1 R, 331/18, 25, 34, 177 R  
See application file for complete search history.

(56) References Cited

U.S. PATENT DOCUMENTS 4,270,097 A   5/1981   Le Tron et al.
4,626,800 A   12/1986  Murakami et al.
4,630,002 A   12/1986  Leiba
4,887,052 A * 12/1989  Murakami et al. ............ 331/96
5,801,591 A   9/1998   Parrott
2003/0098755 A1 5/2003 Basawapatna et al.

FOREIGN PATENT DOCUMENTS

EP   0 318 306   5/1989

OTHER PUBLICATIONS

Jantz W. et al.: "Fine Structure of the Subsidiary Absorption in YIG," Physica Status Solidi A, vol. 31, No. 2, Oct. 16, 1975, pp. 595-604, East Germany.

* cited by examiner

*Primary Examiner*—David Mis  
(74) *Attorney, Agent, or Firm*—Weingarten, Schurgin, Gagnebin & Lebovici LLP

(57) ABSTRACT

A microwave tuned oscillator utilizing a ferromagnetic thin film resonator comprises: a) a microwave resonator (1) comprising a ferromagnetic thin film resonance plate (110) such as a disc-shaped YIG crystal placed on a microwave integrated circuit (11), such as a half-wavelength strip-line resonator, b) bias magnetic field means (12) for applying a bias magnetic field perpendicular to the ferromagnetic thin film resonance plate (110), c) an active element for oscillation (21), a reactive feedback element (24) and a load (23, 25) controlled by the microwave properties of the ferromagnetic thin film resonance plate (110) through a load feedback loop (4), and d) an overall positive feedback loop (3, 14, 15) connected between the active element for oscillation (21) and the microwave resonator (1) to cause a sustained oscillation to build up at one of parametrically excited resonances of the ferromagnetic thin film resonance plate (110).

12 Claims, 3 Drawing Sheets

MICROWAVE OSCILLATOR TUNED WITH A FERROMAGNETIC THIN FILM

This application is a §371 national phase filing of PCT/EP2004/010987 filed Sep. 15, 2004.

BACKGROUND OF THE INVENTION

1. Field of the Invention

The present invention concerns a micro-wave tuned oscillator with ultra-low phase noise. Application includes counters, timers, receivers, or waveform generators and a host of other devices that can be found for example in communication devices, modern computers or their peripherals to name a few.

2. Description of the Related Art

The choice of tunable resonance phenomena benefiting from very large quality factor Q is very limited in the microwave frequency range. Ferromagnetic resonance has been found the best tuning element for microwave oscillators. There are several reasons which explain this preference: one benefits both from the large electronic magnetic moment (as opposed for example to nuclear magnetic resonance, where the Bohr magnetron is 3 order of magnitude weaker) and a saturated magnetization at low field (as opposed for example to para-magnetic resonance which requires very large external field). Thus it ensures that the amplitude of the effect is large. The tuning element is the external magnetic field applied on a ferromagnetic sample through a coil. Another important aspect is that the linewidth is almost independent of the uniformity of the external polarization field. The intrinsic linewidth is thus easily observed. At the moment, the best reference material is a monocristal of ultra-pure yttrium iron garnet (YIG) polished to a perfect sphere. The linewidth there is only limited by the magneto-elastic coupling, called the Kasuya LeCraw mechanism, which is of the order of 0.02 G/GHz.

The scientific literature about YIG-tuned oscillators is very abundant and there are numerous patents on the subject. Preceding publications pertinent to the present invention include Japanese patent No. 53-32671 or U.S. Pat. No. 6,348,840 which describes a high Q YIG-tuned oscillator using a spherical sample. U.S. Pat. Nos. 4,626,800 and 4,887,052 which take full advantage of a microwave integrated circuit (MIC) technology by replacing the sphere with a thin film can also be mentioned. The YIG sample can be patterned as a disc as described in U.S. Pat. No. 4,626,800 without deterioration of the Q.

The present invention takes advantage of the non-linear behavior of a ferromagnetic material such as YIG. This aspect has been addressed in the following publications: H. Suhl, J. Phys. Chem. Solids 1, 209 (1957) and H. Suhl, J. Appl. Phys. 30, 1961 (1959). The literature on parametric excitations is very limited. One work on the subject is reviewed in the following paper: W. Jantz and J. Schneider, Phys. Stat. Sol. (a) 31, 595 (1975).

OBJECT AND SUMMARY OF THE INVENTION

The present invention aims at remedying the drawbacks of the known microwave oscillators tuned with a ferromagnetic thin film.

More specifically it is an object of this invention to provide a YIG tuned oscillator with extremely high Q.

It is still another object of this invention to provide a high Q tuned oscillator that is compact and that can be built in a microwave integrated circuit.

It is still an object of this invention to use this oscillator for sensitive magnetic field detection at large bias.

The present invention proposes to use the parametric resonance as the tuning element of a microwave oscillator. By driving a YIG sample in the non-linear regime, it is possible to observe standing spin-waves resonances that have Qs that are more than an order of magnitude larger than the highest Q reported above. Furthermore, the design proposed is compatible with the improvement described in U.S. Pat. No. 4,887,052 thus providing in particular a compact design compatible with mass production. The low inductance coil described in U.S. Pat. No. 4,887,052 may also be used in combination with the present invention for speed or consumption optimization.

More specifically, the invention relates to a microwave tuned oscillator utilizing a ferromagnetic thin film resonator, characterized in that it comprises:

a) a microwave resonator comprising a ferromagnetic thin film resonance plate placed on a microwave integrated circuit, b) bias magnetic field means for applying a bias magnetic field perpendicular to said ferromagnetic thin film resonance plate, c) an active element for oscillation, a reactive feedback element and a load controlled by the microwave properties of said ferromagnetic thin film resonance plate through a load feedback loop, and d) an overall positive feedback loop connected between said active element for oscillation and said microwave resonator to cause a sustained oscillation to build up at one of parametrically excited resonances of said ferromagnetic thin film resonance plate.

According to an aspect of the present invention, the overall positive feedback loop comprises an amplitude stabilized amplifier for amplifying the output of the active element for oscillation so that a microwave excitation drives the magnetization of the ferromagnetic thin film resonance plate in the non linear motion regime of resonance saturation or subsidiary resonance.

According to a specific embodiment, the amplitude stabilized amplifier comprises clamping means and amplifier means to provide a static microwave excitation to the microwave resonator.

According to a particular aspect of the invention, the overall positive feedback loop further comprises an oscillator and a mixer for superimposing to the output of the amplitude stabilized amplifier a small ac-modulation.

According to another aspect of the invention, the microwave tuned oscillator further comprises a synchronous phase detector operating at the modulation frequency and connected between the microwave resonator and the active element for oscillation.

The ferromagnetic thin film resonance plate is advantageously a YIG (yttrium iron garnet) crystal which is preferably disk-shaped.

The microwave integrated circuit may comprise a half-wavelength strip-line resonator.

According to a specific embodiment, the half-wavelength strip-line resonator comprises an alumina substrate covered on one side by a conducting ground layer and on the other side by a gold stripe having an etched portion, and the YIG crystal is placed at the center of the half-wavelength strip-line resonator, a GGG (gadolinium and gallium garnet) substrate being interposed between the YIG crystal and the half-wavelength strip-line resonator.

The active element for oscillation may comprise a fast transistor such as a GaAs FET.

More specifically the GaAs FET used as a fast transistor may have a drain connected to an impedance matching load, a gate grounded through the reactive feedback element and a source connected to another transistor that varies said load depending on the frequency of the auto-oscillation of the tuned oscillator.

DESCRIPTION OF THE DRAWINGS

Other objects, features and advantages of the present invention will become apparent from the following description taken in conjunction with the accompanying drawings.

DESCRIPTION OF A PREFERRED EMBODIMENT

Figure 1:
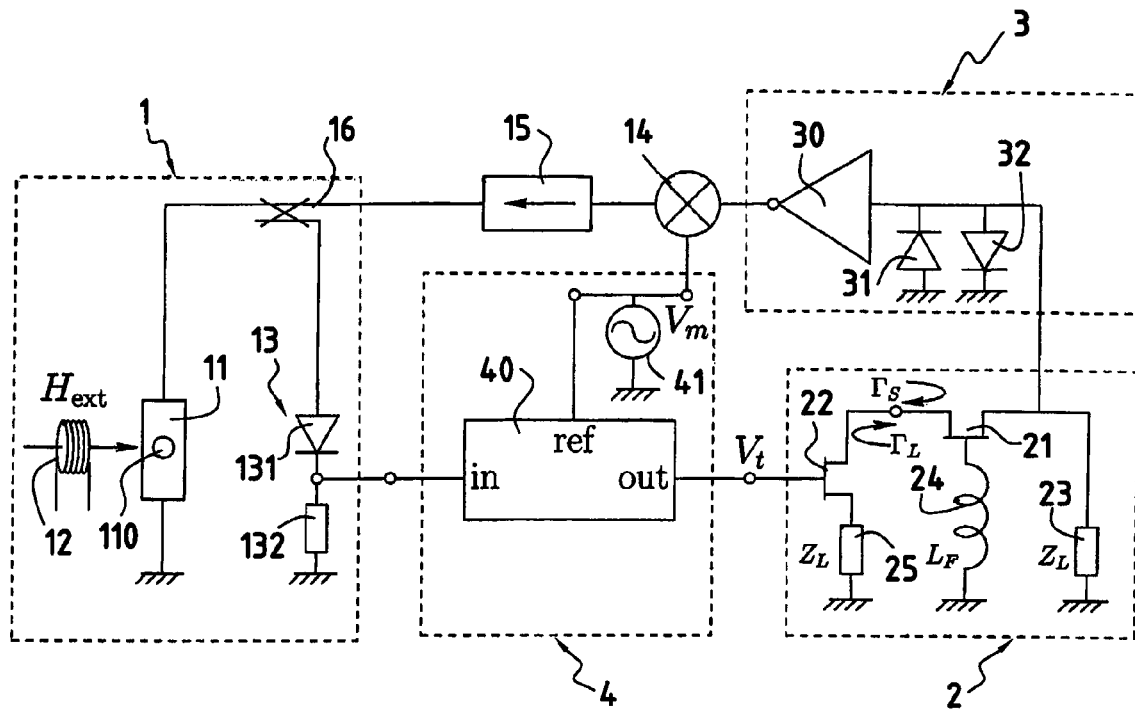
FIG. 1 is a block diagram showing the preferred embodiment for a YIG tuned oscillator (YTO) according to the present invention.

FIG. 1 is a block diagram of an example of a tuned oscillator according to the present invention. This oscillator has been divided into four modules for conveniences: a microwave integrated circuit containing a YIG resonator 110 and its associated detector 13, a tuned oscillator 2, an amplitude stabilized amplifier 3 and a load feedback 4 to the tuned oscillator.

The tuned oscillator 2 comprises a fast transistor 21 like a GaAs FET. The drain of the transistor 21 is connected to an impedance matching load ($Z_L$) 23. The gate is grounded through a feedback reactance (L) 24. The source of transistor 21 is connected to another transistor 22 that varies the load ($Z_L$) 25 depending on the frequency of the auto-oscillation of the tuned oscillator 2. This is achieved by monitoring the properties of a YIG sample 110 placed on a microwave-integrated circuit (MIC) 11 and excited by the oscillator output 16. Overall positive feedback is used to cause a sustained oscillation to build up when the impedance 25 of the source of transistor 21 becomes larger than the impedance matching load 23. If the reflection coefficient $\Gamma_s$ of the microwave viewed from the source of the transistor 21 compensates the reflection coefficient $\Gamma_L$ viewed from the tuned load 25, so that $$\Gamma_s \cdot \Gamma_L = 1 \quad (1)$$

then the circuit auto-oscillates. In the following and according to the present invention, it will be insured that these oscillations occur only at the parametric resonances.

The ferromagnetic thin film resonance plate 110 is an yttrium iron garnet (YIG) crystal grown by liquid phase epitaxy along the 111 direction. The measurements are carried out at T=285±0.02 K (the MIC is temperature stabilized) and the spontaneous magnetization of YIG at this temperature is $4\pi M_s(T)$=1815 G. The YIG crystal 110 is ion milled into a disk of radius $R_s$=80±4 μm and thickness S=4.750±0.001 μm.

Figure 2:
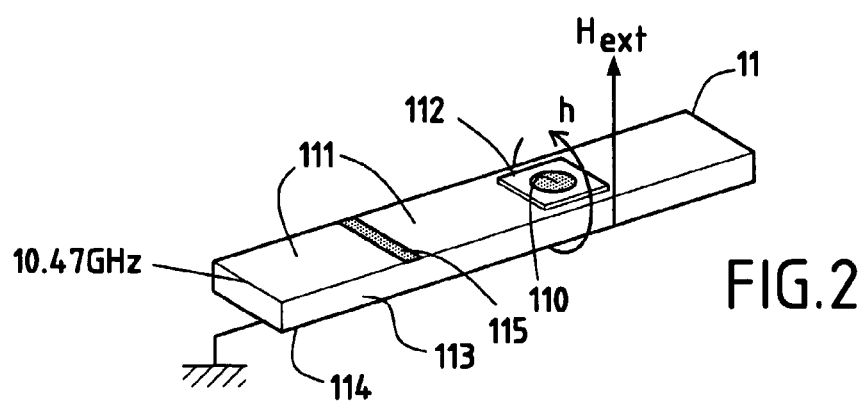
FIG. 2 is a block diagram of a microwave resonator which can be used with the present invention.

The microwave field h generated by the oscillator is fed into an impedance matched strip-line resonator 11 as shown in FIG. 2. The strip line is built by depositing a 2 μm thick and 0.5 mm width gold stripe 111 on an alumina substrate 113 having a thickness of 0.5 mm and covered on the other side by a conducting ground layer 114. The 50 Ω impedance matched resonator is obtained by etching a 32 μm gap 115 across the stripe 111 at 5 mm from the extremity. The quality factor of the strip line cavity 11 is about $Q_L \approx 100$ and its resonance frequency is 10.47 GHz, where 5 mm length defines the resonance half-wavelength. Although the use of a microwave cavity is not absolutely necessary, the $Q_L$ enhancement means that lower microwave power are needed to drive the YIG in the non-linear regime. The YIG disk 110 is placed at the center of this half-wavelength resonator 11, with a 190±5 μm thick GGG substrate 112 intercalated between the YIG disk 110 and the strip line 11. The microwave field h can be considered homogeneous (within 4%) over the volume of the sample.

An external magnetic field $H_{ext}$ is applied perpendicularly to the surface of the YIG disk 110 through a coil 12 (FIG. 1).

Figure 3:
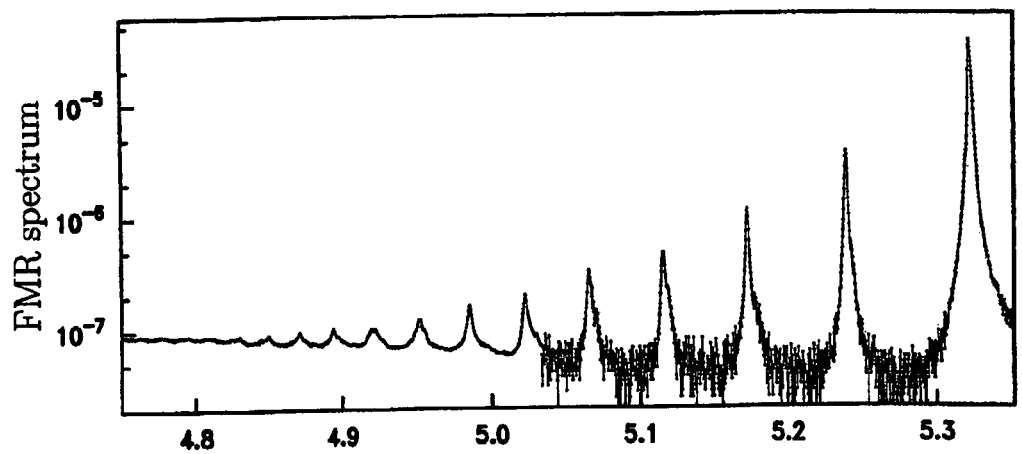
FIG. 3 is a graph showing the main resonances in the linear regime for a YTO.

FIG. 3 shows the microwave susceptibility of the disk 110 as a function of the dc magnetic field $H_{ext}$ applied along the disk axis (Oz). The power reflected from the sample at resonance is detected by a microwave crystal diode 131 (associated with a resistor 132) whose signal is proportional to the imaginary part of the transverse susceptibility $\chi''$ (the latter quantity is spatially averaged over the sample volume). When sweeping $H_{ext}$, a multiplicity of ferromagnetic resonance (FMR) absorption maxima are observed which are identified as the harmonics of the fundamental mode excited along the diametrical direction, as explained e.g. in the following article: V. Charbois, V. V. Naletov, J. Ben Youssef, and O. Klein, J. Appl. Phys. 91, 7337 (2002). The measured resonances are ascribed to magnetostatic waves propagating radially across the sample. Their separation is determined by the cylinder aspect ratio described by J. F. Dillon, J. Appl. Phys. 31, 1605 (1960). They are labeled by (n, m), the number of nodes respectively in the diametrical and circumferential directions. Magneto-exchange modes have been found to be negligible for film thickness above 5 μm as explained by P. E. Wigen, Thin Solid Films 114, 135 (1984). The linewidth of the peaks is of the order of 1.5 G, a typical value for YIG disks as mentioned by J. R. Eshbach, J. Appl. Phys. 34, 1298 (1963).

Although the discussion below can be extended to any of the magnetostatic modes above, we will concentrate from now on, on the main resonance which is the most intense peak. This mode has a transverse wavevector $k_o \approx \pi/D$ and is referred hereof as the uniform precession because its phase is uniform through out the sample. The normalized number of uniform magnons is $n_u = \frac{1}{2}|u_0|^2$, with $u_0 = \chi'' h/M_s$, h being the circularly polarized amplitude of the rf field and $M_s$ the saturation magnetization at thermal equilibrium. The energy relaxation rate of the uniform precession directly to the lattice will be written $\eta_0/\gamma$=1.07 G. For finite aspect ratio disk as mentioned by M. J. Hurben and C. E. Patton, J. Appl. Phys. 83, 4344 (1998), the uniform precession is degenerate with other spin-waves motions. Inhomogeneities, impurities or crystal defects lead to a linear coupling between the uniform precession and degenerate modes of the form $u_k e^{-i\omega_k t}$ of identical energies ($\omega_k = \omega_0$) but different wavevectors (k>>$k_0$), propagating at an angle $\theta_k$ from the normal of the disk, $\overline{\eta_k}$ being their average decay rate to the thermodynamic equilibrium. If $\eta_{sp}/\gamma$=0.2 G is the constant decay of the uniform precession due to inhomogeneities scattering, for perpendicularly magnetized disk, it is expected that $\eta_{sp}$ is small.

As shown by Suhl in the article of J. Phys. Chem. Solids 1, 209 (1957), second order effects in the demagnetizing energy become important when the precession angle exceeds a couple of degrees. They destroy the independence of the degenerate spin-waves modes. Expressed as a power series in $u_0^2$, the leading matrix elements at resonance are the terms $\xi_k u_0^2$ which couple degenerate modes of equal and opposite wave vectors (+k, −k). Here Suhl's notation is purposely used, so that the reader can refer to the above-mentioned article for a complete treatment. The coupling $\xi_k$ depends on $\theta_k$ and the maximum amplitude $\xi_K|max/\gamma=2\pi M_s$ ($\approx$900 G) is obtained for spinwaves propagating at $\theta_k=0$ (along z). In the disk 110 of the present invention, these spinwaves have a wavevector $k_{max} \approx 6.3 \times 10^4$ cm$^{-1}$ which is calculated from the magnon manifold. The coupling mechanism reaches a critical threshold when $2\xi_k|u_0|^2$ becomes comparable to $\eta_z/\gamma$=0.15 G, the relaxation $\tilde{\eta}$ rate to the lattice of these z-directed magnons. The uniform motion then breaks down in parametrically excited spinwave pairs propagating along the M direction at $k_{max}$. The important consequence then is the resonance saturation of the uniform mode. It may be described as a reduction of the effective decay rate $\tilde{\eta}_z$ of these parametrically excited pairs, which becomes infinitely small as the amplitude of the uniform mode approaches the critical value. It is proposed to use this infinitely small linewidth to tune the oscillator according to the present invention. An analytical expression for the non-linear correction $f(n_u)=\eta_z/\tilde{\eta}_z$ was derived by Suhl, $$f(n_u) = \frac{1}{\sqrt{1-n_u^2/n_c^2}}, \quad (2)$$

neglecting the non-linear interaction between degenerate spinwaves (k≠0) except for that part which couples them to the uniform mode. The critical number of uniform magnons $n_c=\frac{1}{2}\chi''_0{}^2 h_c^2/M_s^2$ depends on $\chi''_0=2\gamma M_s/(\eta_0+\eta_{sp})$, the low power susceptibility and $$h_c^2 = \frac{(\eta o/2 + n_{sp}/2)^2}{\gamma^2} \frac{\eta_z}{2\xi_k}$$

the saturation power.

Figure 4:
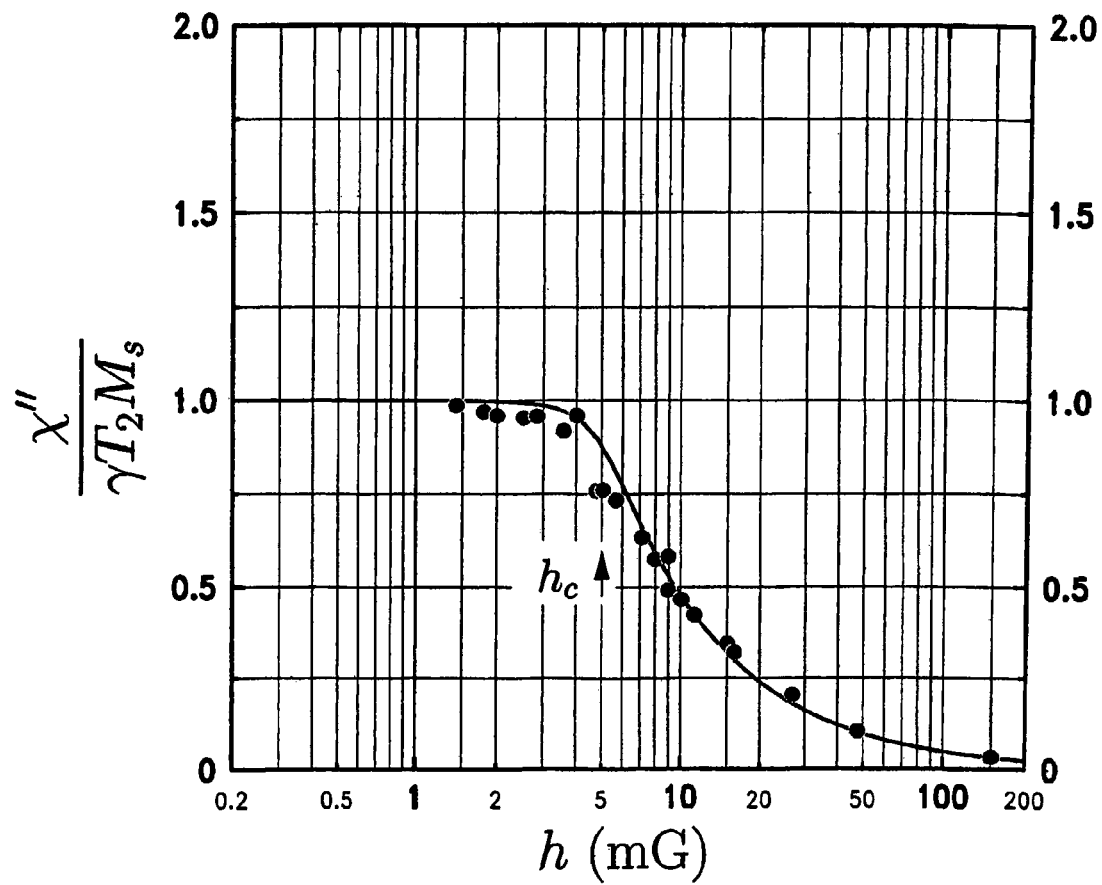
FIG. 4 is a graph showing the transverse microwave susceptibility as function of the microwave field strength for a YTO.

On FIG. 4 the rf field dependence is plotted as a function of both $\chi''$ evaluated at resonance. It may be observed that the microwave susceptibility data exhibit a premature saturation behavior at $h_c$=5 mG. In the presence of two-magnon scattering, it was shown that the susceptibility obeys the implicit equation:

$$\chi'' = \frac{2\gamma M_s}{\eta o + \eta sp \int f\left(\frac{1}{2}\chi''^2 h^2/M_s^2\right)}, \quad (3)$$

where the function $f$ is defined in equation 2. The observed value of $h_c$=5 mG for a disk 110 of the present invention is in agreement with the prediction. The idea of the invention is to excite the disk 110 at $h_c$ and monitor the susceptibility around this threshold. The aim of the present invention is to use the resonance linewidth determined by the loss parameter $\tilde{\eta}_k$ instead of $\eta_0$.

A constant microwave field of 20 μW ($h_0$=8 mG) is thus applied to the sample 110. This is achieved by clamping the output of the tuned oscillator 2 through a diode bridge 31, 32 and then amplifying the output with amplifier 30 at the desired power level in the amplitude stabilized amplifier 3 (FIG. 1). This power level ensures that the microwave level is just above the saturation threshold. The field is strong enough to drive the uniform precession near saturation and consequently bring both degenerate magnons close to the lifetime instability. Onto this static pumping a small ac-modulation of the microwave power 0.1 μW$_{pp}$ is superimposed. The quantities are obtained by using source modulation of the full power, i.e. $\epsilon$=1 where $$h = h_0\left\{1 + \frac{\varepsilon}{2}\cos(\omega_s t) - \frac{\varepsilon}{2}\right\}.$$

Figure 5:
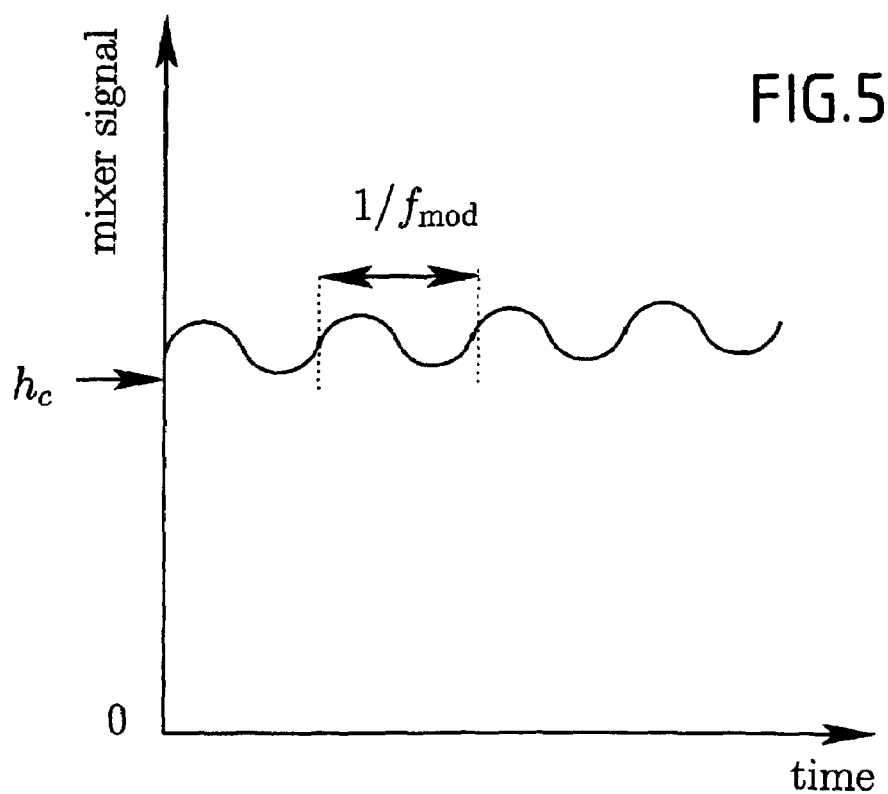
FIG. 5 is a graph showing the source modulation sequence of a YTO according to the invention.
Figure 6:
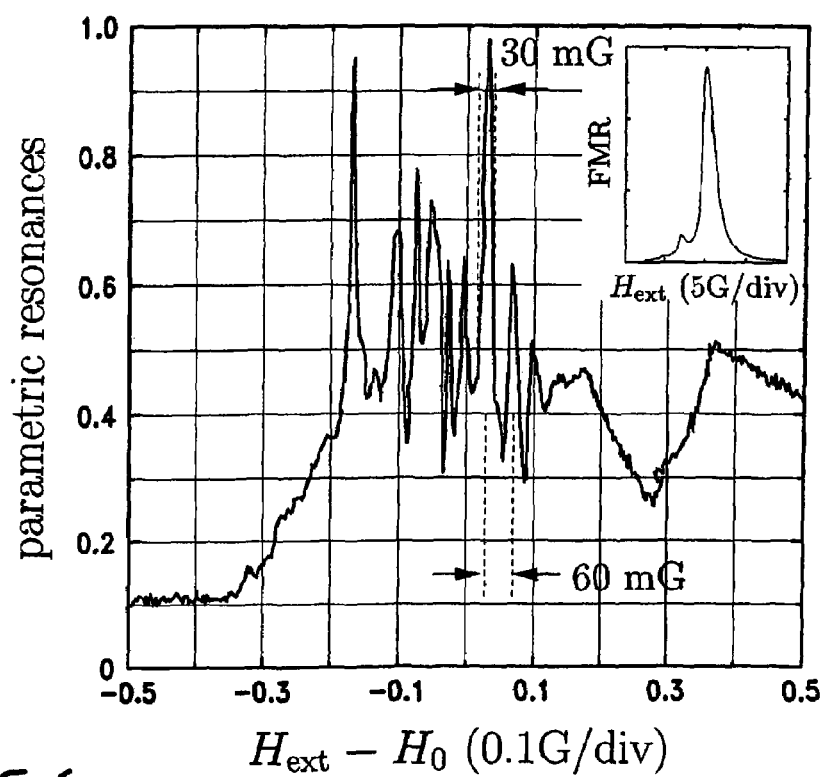
FIG. 6 is a graph showing the corresponding parametric resonances which can be used with a YTO according to the invention.

It corresponds to a modulation in amplitude of the incident microwave with $\epsilon$=0.0025. The output of the amplitude stabilized amplifier 3 is applied to an input of a mixer 14 (FIG. 1). FIG. 5 shows the voltage applied to the mixer 14 from an oscillator 41 in order to obtain the source modulation. The output of the mixer 14 is applied through an isolator 15 to an input 16 of the YIG resonator 1. The signal measured in-phase with the modulation $\omega_s$ by a lock-in technique is plotted on FIG. 6. A series of extremely narrow peaks identified as parametric resonances may be observed. The width at half power of these peaks is about 0.03 G, among the smallest linewidth ever reported in the literature for FMR. This value is consistent with the decrease of $\tilde{\eta}_k$ predicted by equation 2. The distance between the peaks is approximately 0.06 G. This result is interpreted by first noticing that the possible mode of oscillations must be consistent with the boundary conditions. Therefore the allowed spinwave k is discrete in the finite size sample and the k-space length scale is defined by the largest sample dimension $\Delta k=\pi/D$. A surface of constant energy therefore intercepts this discrete grid at a constant spacing $\Delta H=2$ $Dk\Delta k$ with D/h=0.089 cm$^2$radsec$^{-1}$ the exchange constant in YIG. Numerical applications yields $\Delta H$=0.12 G in fare agreement with the experimental data. Upon increasing $\epsilon$, it is observed experimentally a merging of the sharp peaks together which is simply understood as a frequency modulation effect.

These synchronously detected parametric resonances are then feed-backed to the oscillator through a FET transistor 22 which receives on its gate a signal $V_t$ provided by a phase detector 4 having a circuit 40 receiving a reference signal from the oscillator 41 and an input signal from the detector 13 of the YIG resonator 1.

It should be noted that it is also possible to use the longitudinal signal instead of the $\chi''$ to monitor the non-linear dynamics of the YIG crystal 110. A mechanical detector can be used (for example a magnetic force microscope or a coil (for example as described in the article of R. W. Damon, Rev. Mod. Phys. 25, 239 (1953)).

Thus the present invention proposes a tuned oscillator 2 locked on the parametrically excited resonance in a ferromagnetic thin film 110. The tuned oscillator 2 includes a fast transistor 21, a reactive feedback element 24 and a load 23 controlled by the microwave properties of a yttrium iron garnet (YIG) film 110. The oscillator signal is fed into a microwave resonator 11 containing the YIG sample 110. Overall positive feedback is used to cause a sustained oscillation to build up at one of the YIG parametrically excited resonances. This is achieved by amplifying the oscillator output so that the microwave excitation drives the YIG magnetization in the non-linear motion regime (resonance saturation or subsidiary resonance). A small ac-modulation (source of frequency 41) is superimposed to the above static excitation provided by the amplifier 3. Very sharp resonances occur at the parametrically excited standing spin-waves. These are amplified by a synchronous detector 4 operating at the modulation frequency. The output of the synchronous detector 4 controls the load of the oscillator 2. Since the parametrically excited resonance have much larger Q than the main resonance, ultra-high frequency stability is obtained.

The invention claimed is:

1. A microwave tuned oscillator utilizing a ferromagnetic thin film resonator, characterized in that it comprises:
   a) a microwave resonator comprising a ferromagnetic thin film resonance plate placed on a microwave integrated circuit,
   b) bias magnetic field means for applying a bias magnetic field perpendicular to said ferromagnetic thin film resonance plate,
   c) an active element for oscillation, a reactive feedback element and a load controlled by the microwave properties of said ferromagnetic thin film resonance plate through a load feedback loop, and
   d) an overall positive feedback loop connected between said active element for oscillation and said microwave resonator to cause a sustained oscillation to build up at one of parametrically excited resonances of said ferromagnetic thin film resonance plate.

2. A microwave tuned oscillator according to claim 1, characterized in that said overall positive feedback loop comprises an amplitude stabilized amplifier for amplifying the output of the. active element for oscillation so that a microwave excitation drives the magnetization of the ferromagnetic thin film resonance plate in the non linear motion regime of resonance saturation or subsidiary resonance.

3. A microwave tuned oscillator according to claim 2, characterized in that said amplitude stabilized amplifier comprises clamping means and amplifier means to provide a static microwave excitation to the microwave resonator.

4. A microwave tuned oscillator according to claim 2, characterized in that said overall positive feedback loop further comprises an oscillator and a mixer for superimposing to the output of the amplitude stabilized amplifier a small ac modulation.

5. A microwave tuned oscillator according to claim 1, characterized in that it further comprises a synchronous phase detector operating at the modulation frequency and connected between the microwave resonator and the active element for oscillation.

6. A microwave tuned oscillator according to claim 1, characterized in that the ferromagnetic thin film resonance plate is a YIG (yttrium iron garnet) crystal.

7. A microwave tuned oscillator according to claim 6, characterized in that the YIG crystal is disk-shaped.

8. A microwave tuned oscillator according to claim 6, characterized in that the microwave integrated circuit comprises a half-wavelength strip-line resonator.

9. A microwave tuned oscillator according to claim 8, characterized in that the half-wavelength strip-line resonator comprises an alumina substrate covered on one side by a conducting ground layer and on the other side by a gold stripe having an etched portion, and the YIG crystal is placed at the center of the half-wavelength strip-line resonator, a GGG (gadolinium and gallium garnet) substrate being interposed between the YIG crystal and the half-wavelength strip-line resonator.

10. A microwave tuned oscillator according to claim 1, characterized in that the active element for oscillation comprises a fast transistor.

11. A microwave tuned oscillator according to claim 10, characterized in that said fast transistor is a Ga As FET, having a drain connected to an impedance matching load, a gate grounded through said reactive feedback element and a source connected to another transistor that varies said load depending on the frequency of the auto-oscillation of the tuned oscillator.

12. A microwave tuned oscillator according to claim 3, characterized in that:
    said overall positive feedback loop further comprises an oscillator and a mixer for superimposing to the output of the amplitude stabilized amplifier a small ac modulation;
    it further comprises a synchronous phase detector operating at the modulation frequency and connected between the microwave resonator and the active element for oscillation;
    the ferromagnetic thin film resonance plate is a YIG (yttrium iron garnet) crystal;
    the YIG crystal is disk-shaped;
    the microwave integrated circuit comprises a half-wavelength strip-line resonator;
    the half-wavelength strip-line resonator comprises an alumina substrate covered on one side by a conducting ground layer and on the other side by a gold stripe having an etched portion, and the YIG crystal is placed at the center of the half-wavelength strip-line resonator, a GGG (gadolinium and gallium garnet) substrate being interposed between the YIG crystal and the half-wavelength strip-line resonator;
    the active element for oscillation comprises a fast transistor; and
    said fast transistor is a Ga As FET, having a drain connected to an impedance matching load, a gate grounded through said reactive feedback element and a source connected to another transistor that varies said load depending on the frequency of the auto-oscillation of the tuned oscillator.

* * * * *

UNITED STATES PATENT AND TRADEMARK OFFICE
CERTIFICATE OF CORRECTION

PATENT NO. : 7,528,663 B2
APPLICATION NO. : 11/662838
DATED : May 5, 2009
INVENTOR(S) : Vladimir Naletov et al.

It is certified that error appears in the above-identified patent and that said Letters Patent is hereby corrected as shown below:

Column 7, claim 2, line 37, "the." should read --the--.

Signed and Sealed this

Sixth Day of April, 2010

David J. Kappos
*Director of the United States Patent and Trademark Office*